June 7, 1960 J. I. PANKOVE 2,940,022

SEMICONDUCTOR DEVICES

Filed March 19, 1958

INVENTOR.
JACQUES I. PANKOVE
BY J. L. Whittaker
ATTORNEY

United States Patent Office 2,940,022
Patented June 7, 1960

2,940,022

SEMICONDUCTOR DEVICES

Jacques I. Pankove, Princeton, N.J., assignor to Radio Corporation of America, a corporation of Delaware Filed Mar. 19, 1958, Ser. No. 722,501

18 Claims. (Cl. 317—235)

This invention relates to semiconductor devices, and more particularly to improved unipolar devices.

Semiconductor devices such as transistors may be classified as bipolar and unipolar. Bipolar devices utilize both N-type charge carriers (electrons) and P-type charge carriers (holes) in their operation. Unipolar devices depend for their operation on charge carriers of one type only.

A typical unipolar transistor comprises a semiconductor body, such as a rod or cylinder of germanium or silicon or the like, having a rectifying electrode disposed between two non-rectifying or ohmic electrodes. The semiconductor body may be of either conductivity-type, but is usually N-type, since electron mobility is greater than hole mobility. One of the ohmic electrodes is known as the source, while the other is known as the drain. The electron current of the device flows from the source to the drain electrode. The current conducting portion of the semiconductor body between these two electrodes is known as the channel. The rectifying electrode, which serves as the input electrode, is known as the gate. In operation, the rectifying electrode is biased in the reverse direction, so as to extend a depletion layer into the semiconductor body and thus increase the resistivity of the conducting channel between the source and the drain. The input signal is impressed on the rectifying electrode, and modulates the depth or thickness of the depletion layer. The resistance of the semiconductor body is thereby varied by the input signal, and hence the output current is modulated by the signal current. However, it has hitherto been difficult to produce satisfactory unipolar devices for high-frequency operation.

Accordingly, an object of this invention is to provide improved semiconductor devices.

Another object of this invention is to provide improved unipolar devices.

Still another object of this invention is to provide improved unipolar transistors suitable for high-frequency operation.

An additional object is to provide a simplified and inexpensive method of making unipolar devices.

These and other objects of the instant invention are accomplished by providing a device comprising a semiconductor body or wafer of given conductivity-type with a thin surface zone of opposite conductivity-type. While the wafer shape is not critical, and may for example be a cylinder or a plate, a generally rod-shaped body is preferred. Next a metallic ring or metal band is attached around the body. The metal or metallic alloy selected is one which is capable of imparting said given conductivity type to the semiconductor body, hence the contact between the metal band and the opposite conductivity type surface zone is rectifying in character. At two opposite ends of the body there is connected an electrode that is ohmic or non-rectifying with respect to the thin surface zone. To complete the device, electrical leads are connected to each electrode and to the metallic ring, which serves as the gate electrode. In operation, the thin opposite conductivity type surface zone of the body serves as the conducting channel between the source and the drain, while the given type central zone or core of the body is electrically inactive.

The invention will be described in greater detail by reference to the drawing, in which:

Figures 1*a*–1*d* are cross-sectional views illustrating successive steps in one method for the fabrication of a device in accordance with the invention;

Similar reference characters are applied to similar elements throughout the drawing.

Figure 1A:
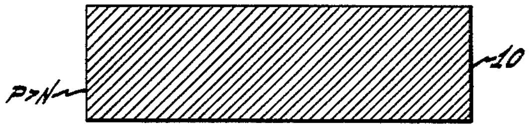

Referring to Figure 1*a*, a semiconductive body 10 is prepared of given conductivity type monocrystalline material such as germanium or silicon or the like. In this example, the body 10 consists of a germanium rod or cylinder containing sufficient donor impurity atoms to be of N-type conductivity. The donor may for example be antimony. The semiconductor body is then converted to opposite type conductivity by adding a fast-diffusing acceptor impurity. In this example, the body 10 is immersed in an aqueous solution of copper nitrate for a few seconds, then heated at 750° C. for 10 minutes in an inert atmosphere such as argon. During this step copper atoms diffuse through the body 10 and convert it to P-type.

Figure 1B:
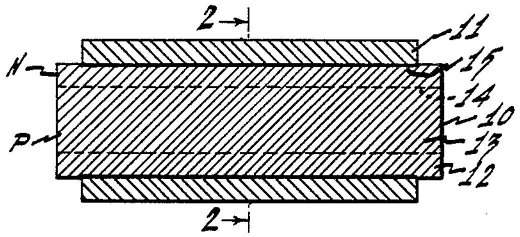

Referring to Figure 1*b*, a metallic ring 11 is fused around the semiconductor body 10. The ring 11 is made of a metal or alloy which induces in the particular semiconductor utilized conductivity of the same type as the fast-diffusing impurity. In this example, the metallic ring or band 11 consists of indium. The indium ring 11 and the germanium body 10 are heated at about 550° C. for about 10 minutes in an inert atmosphere. Since copper is more soluble in indium than in germanium, the copper atoms in the surface region 12 adjacent to the indium ring 11 diffuses into the indium, and remain dissolved therein. The process involved is similar to the extraction of a solute from a first solvent by means of a second solvent which has a greater solubility for the solute.

Figure 2:
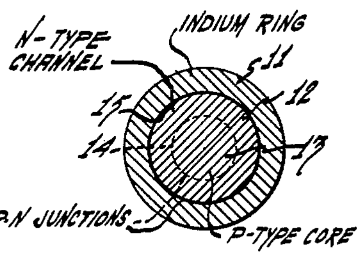
Figure 2 is a section along the line 2—2 of Figure 1*b*.

Although the surface zone 12 is depleted with respect to copper atoms, the concentration of donor impurity atoms in zone 12 remains virtually constant, since relatively few donor impurity atoms diffuse into the indium. It has been found that the diffusion constant of copper in germanium is about one million times greater than the diffusion constant of conventional donor impurities such as phosphorus, arsenic and antimony. Since the acceptor concentration of the surface region 12 is considerably reduced while the donor concentration remains virtually constant, the surface zone 12 is reconverted to N-type conductivity. A PN junction is thus formed at the interface 14 between the N-type surface zone 12 and the P-type central zone 13 or core of the semiconductor body 10. A second PN junction 15 is formed between the indium ring 11 and the N-type surface zone 12. Figure 2 is a section along the line 2—2 of Figure 1*b*.

Figure 1C:
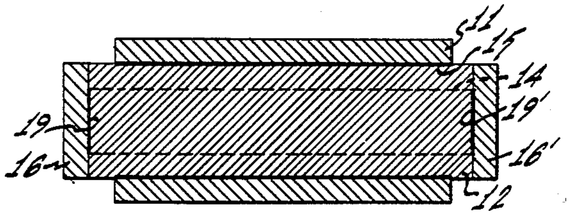

Referring to Figure 1*c*, an electrode 16 is attached to one end of the semiconductor body 10. The electrode 16 may for example be a pellet or a disc, and may be soldered or alloyed to the semiconductor body 10. However, the electrode material and any solder utilized must make an ohmic contact to the N-type surface zone 12, and hence a rectifying contact to the P-type core 13 of the semiconductor body 10. In this example, the electrode 16 is a disc composed of 99% lead–1% arsenic, and is soldered to the semiconductor body. The arsenic present makes the electrode strongly N-type, thus insuring an ohmic connection to the N-type surface zone 12 and a rectifying junction 19 with the P-type core 13. A similar electrode 16' is attached to the opposite end of the semiconductor body, forming an ohmic connection with surface zone 12 and a rectifying junction 19' with the P-type core 13.

Figure 1D:
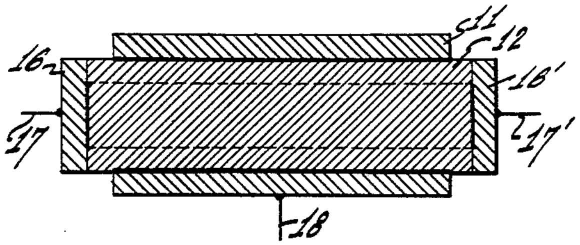

Referring to Figure 1*d*, the device is completed by attaching leads 17 and 17' to electrodes 16 and 16' respectively, and lead 18 to the indium ring 11. The leads may for example be copper, nickel or one of the noble metals.

Figure 3:
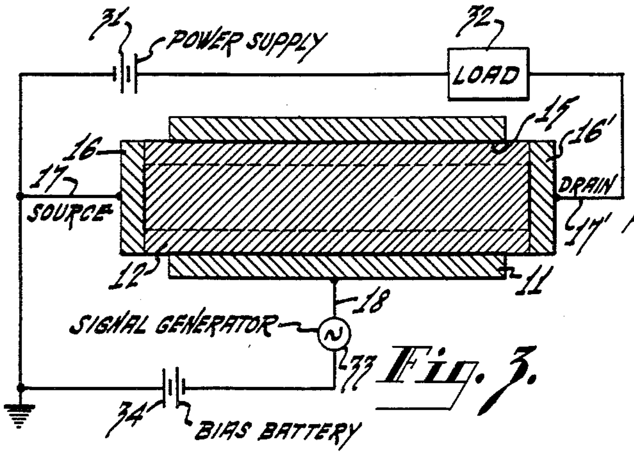
Figure 3 is a schematic diagram of a unipolar device in accordance with the invention and an associated circuit for its operation.

Referring to Figure 3, the device shown in Figure 1*d* may be operated in a circuit utilizing electrodes 16 and 16' as the source and drain electrodes respectively. In the operation of a device having an N-type channel and a P-type gate region, the negative terminal of a suitable power supply such as a battery 31 is connected to the source electrode lead 17. The positive terminal of the battery 31 is connected to the load circuit 32, which in turn is connected to the drain electrode lead 17'. The control or gate electrode 11 is connected by means of gate lead 18 to a signal generator 33 and to the negative terminal of a bias battery 34. The positive terminal of the bias battery 34 is grounded. The above polarities are reversed for a device having a P-type channel and an N-type gate.

In the mode of operation of the device shown in Figure 3, the N-type source electrode 16 injects a current of electrons into the N-type surface zone 12. Electrons are not injected into the P-type core, since the PN barrier between the arsenic-doped N-type source 16 and the P-type core 13 opposes such a flow. The electron current flows through the N-type zone 12, which serves as the current channel, to the drain electrode 16'. The gate electrode 11, by means of the bias voltage of bias battery 34 and the signal voltage of signal generator 33 applied thereto, forms a depletion layer which extends from the rectifying barrier 15 into the conducting channel of the device and modifies the resistivity of the thin surface zone 12 which acts as the channel between the source 16 and the drain 16'. The gate electrode thus modulates, in accordance with the applied signal, the output current flowing between the source and drain electrodes through the load 32.

A feature of unipolar devices according to this invention is the combination of a thin channel and a gate having a large girth to length ratio, which results in greater sensitivity and improved performance at higher frequencies than in conventional unipolar devices.

Another feature of unipolar devices in accordance with this invention is the provision of a central core of given conductivity type electrically inactive material around which is disposed a thin electrically active zone of opposite conductivity type. Although the central core of the device does not take an active part in the electrical operation thereof, the core makes the device more rugged and easier to handle. Another advantage of this structure is that it enables easy attachment of the ohmic source and drain electrodes at each end of the unit.

In larger units intended for operation at high power levels, a hole may be bored through the central core 13, and a coolant circulated therethrough to remove the heat dissipated by the unit, in a manner similar to that described in my Patent 2,754,455, issued July 10, 1956, and assigned to the same assignee. The power handling capability of the unit is thereby increased.

It will be understood that in the device described the materials have been mentioned by way of example only. Other combinations of acceptors and donors, such as nickel and arsenic, may be utilized. The invention may also be practiced with other monocrystalline semiconductors such as silicon, germanium-silicon alloys, indium phosphide, gallium arsenide, and the like.

For special applications, the conductivity types may be reversed to form devices in which the conducting channel is a thin P-type zone and around an N-type core. In such devices, the current which flows in the P-type channel between the source and drain consists of holes. For example, a monocrystalline germanium cylinder may be prepared by methods known to the art with sufficient indium as impurity to be of P-type conductivity. Lithium is diffused into the germanium to convert it to N-type conductivity. An annular electrode of 99% lead–1% arsenic is then alloyed around the germanium cylinder, thereby leaching sufficient lithium from the surface zone of the cylinder to leave said zone P-type. The annular electrode contains arsenic donor atoms, hence it forms a rectifying contact to the P-type surface zone. Indium electrodes are next alloyed to each end of the cylinder. These electrodes are ohmic to the P-type surface zone, but rectifying to the N-type core. It will be understood that when the conductivity types of the various electrodes are reversed, the bias voltage polarities are also reversed as required.

Unipolar devices in accordance with the invention may alternatively be fabricated as follows. A given conductivity type monocrystalline wafer is prepared of a semiconductive material such as gallium arsenide or silicon or the like. The wafer may be a plate or a cylinder or a generally rod-shaped body. In this example, the wafer consists of a silicon cylinder containing sufficient acceptor impurity atoms to be of P-type conductivity and about 50 ohm-centimeter resistivity. The acceptor may for example be boron.

Next a thin surface zone of the silicon wafer is converted to opposite conductivity type. When the wafer is P-type, a surface zone of N-type conductivity may be formed by heating the wafer in an atmosphere of nitrogen containing a donor impurity, which may for example be phosphorus. In this example, the nitrogen has previously been passed over phosphorus pentoxide kept at about 220° C. to 660° C. An amorphous glassy phosphorus-containing film is formed over the wafer surface. The ambient is then changed to pure nitrogen, and the wafer is heated for about ½ hour at about 1300° C. During this step the phosphorus diffuses from the glassy surface film into the adjacent zone of the wafer, and forms a thin N-type layer over the surface of the silicon body. In this example, the N-type surface zone thus produced is about 0.5 mil thick.

Next an annular gate electrode is secured to the silicon cylinder in rectifying contact to the surface zone thereof. In this example, the annular electrode consists of an indium ring, which is alloyed around the silicon cylinder by heating the assembly of wafer and ring to a temperature of about 300° C. for about 10 minutes. Under these conditions, the depth of penetration by the ring into the wafer is shallow, which is desirable since the N-type surface zone is relatively thin.

Electrode pellets are then attached to each end of the silicon cylinder by either alloying or soldering techniques. These electrodes serve as the source and the drain of the unit. The electrode pellet material is one which forms a high conductivity non-rectifying electrical contact with the N-type surface zone of the silicon body, and a rectifying contact with the P-type core or central zone of the body. One suitable electrode composition consists of 100 parts lead and 12 parts antimony, as disclosed in application Serial No. 309,867, assigned to the same assignee. Another suitable electrode composition consisting of lead, gold, and a donor is disclosed in U.S. application Serial No. 433,351, assigned to the same assignee. A flux consisting of a fluorine salt may be utilized to promote the alloying of the pellet to the silicon wafer, as described in U.S. 2,807,561, issued September 24, 1957, assigned to the same assignee.

To complete the device, leads are attached to the electrode pellet at each end of the unit, and to the annular gate electrode. The leads may for example be copper, nickel, or a noble metal.

It will be understood that this method can be practiced with all the conventional monocrystalline semiconductor materials, including semiconductive compounds such as gallium arsenide and indium phosphide, by utilizing appropriate acceptors and donors known to the art. The semiconductor is selected in accordance with the particular application of the device. For example, silicon devices may be operated at higher ambient temperatures than germanium devices, and gallium arsenide devices are capable of operation at higher temperatures than silicon devices.

It will also be understood that the conductivity types of the various zones of the device described may be reversed, providing that the polarity of the applied bias voltages is similarly reversed as required.

There have thus been described new and useful forms of semiconductor devices, as well as methods for making these devices.

What is claimed is:

1. A semiconductor device comprising a monocrystalline semiconductive body having a central zone of given conductivity type and a thin surface zone of opposite conductivity type, a metallic ring around said body, said metal being capable of imparting said given conductivity type to said semiconductor, an electrode connected to each end of said body, said electrodes being ohmic with respect to said surface zone, and leads connected to each said electrode and said metal ring.

2. An electrical device comprising a monocrystalline semiconductor body having a central zone of given conductivity type and a thin surface zone of opposite conductivity type, a metal band in rectifying contact to said surface zone around said body, an electrode connected to each end of said body, said electrodes being non-rectifying with respect to said surface zone, and leads connected to each said electrode and said metal band.

3. An electrical device comprising a rod-shaped monocrystalline semiconductor body having a central zone of given conductivity type and a thin surface zone of opposite conductivity type, a metallic ring alloyed around said body, said ring being in rectifying contact with said surface zone, an electrode connected to each end of said body, said electrodes being non-rectifying with respect to said surface zone, and leads connected to each said electrode and said metal ring.

4. An electrical device comprising a rod-shaped monocrystalline semiconductor body having a central zone of given conductivity type and a thin surface zone of opposite conductivity type, a metal band alloyed around said body, said metal being capable of imparting said given conductivity type to said semiconductor, an electrode connected to each end of said body, said electrodes being non-rectifying with respect to said opposite type surface zone, and leads connected to each said electrode and said metal band.

5. An electrical device comprising a rod-shaped monocrystalline semiconductor wafer containing two type-determining impurities, the central zone of said wafer containing an excess of one said impurity so as to be of given conductivity type, the surface zone of said wafer containing an excess of the other said impurity so as to be of opposite conductivity type, an annular electrode wrapped around said wafer in rectifying contact with said surface zone, an electrode connected to each end of said wafer in non-rectifying contact to said surface zone, and leads connected to each said electrode.

6. An electrical device comprising a rod-shaped monocrystalline semiconductor wafer containing both acceptor and donor impurities, the surface zone of said wafer containing an excess of said donor impurities so as to be of N-conductivity type, the central zone of said wafer containing an excess of said acceptor impurities so as to be of P-conductivity type, an annular electrode wrapped around said wafer and in rectifying contact with said N-type surface zone, an electrode connected to each end of said wafer in non-rectifying contact to said surface zone, and leads connected to each said electrode.

7. A unipolar transistor comprising a rod-shaped monocrystalline semiconductive germanium wafer having both acceptor and donor impurities, said acceptor impurities consisting principally of nickel atoms and said donor impurity consisting principally of arsenic atoms, the surface zone of said wafer containing an excess of said arsenic atoms so as to be of N-conductivity type, the central zone of said wafer containing an excess of said nickel atoms so as to be of P-conductivity type, an annular indium electrode alloyed around said wafer in rectifying contact with said N-type surface zone, an electrode alloyed to each end of said wafer in non-rectifying contact to said surface zone, and leads connected to each said electrode.

8. A unipolar transistor comprising a monocrystalline semiconductive germanium cylinder having both acceptor and donor impurities, said acceptor impurity consisting principally of copper atoms and said donor impurity consisting principally of antimony atoms, the surface zone of said cylinder containing an excess of said antimony atoms so as to be of N-conductivity type, the central zone of said cylinder containing an excess of said copper atoms so as to be of P-conductivity type, an annular indium electrode alloyed around said cylinder in rectifying contact with said N-type surface zone, an electrode alloyed to each end of said cylinder in non-rectifying contact to said surface zone, and leads connected to each said electrode.

9. A unipolar transistor comprising a monocrystalline semiconductive silicon cylinder containing both acceptor and donor impurities, said acceptor impurities consisting principally of boron atoms and said donor impurity consisting principally of phosphorus atoms, the surface zone of said cylinder containing an excess of said phosphorus atoms so as to be of N-conductivity type, the central zone of said cylinder containing an excess of said boron atoms so as to be of P-conductivity type, an annular indium electrode alloyed around said cylinder in rectifying contact with said N-type surface zone, an electrode alloyed to each end of said cylinder in non-rectifying contact to said surface zone, and leads connected to each said electrode.

10. An electrical device comprising a rod-shaped monocrystalline semiconductor wafer containing both acceptor and donor impurities, the surface zone of said wafer containing an excess of said acceptor impurity so as to be of P-conductivity type, the central zone of said wafer containing an excess of said donor impurities so as to be of N-conductivity type, an annular electrode wrapped around said wafer in rectifying contact with said P-type surface zone, an electrode connected to each end of said wafer in non-rectifying contact to said surface zone, and leads connected to each said electrode.

11. A unipolar transistor comprising a monocrystalline semiconductive germanium cylinder containing both acceptor and donor impurities, said acceptor impurity consisting principally of indium atoms and said donor impurity consisting principally of lithium atoms, the surface zone of said cylinder containing an excess of said indium atoms so as to be of P-conductivity type, the central zone of said cylinder containing an excess of said lithium atoms so as to be of N-conductivity type, an annular electrode of 99% lead–1% arsenic alloyed around said cylinder in rectifying contact with said P-type surface zone, an electrode alloyed to each end of said cylinder in non-rectifying contact to said surface zone, and leads connected to each said electrode.

12. A method of fabricating a unipolar transistor comprising the steps of double-doping a rod-shaped monocrystalline semiconductor wafer with a fast-diffusing impurity of given conductivity type, and a slow-diffusing impurity of opposite conductivity type, alloying around said wafer an annular metal electrode so as to leach a portion of said fast-diffusing impurity from the wafer surface zone adjacent said annular electrode, said metal inducing given conductivity type in said semiconductor and having a greater solubility for said fast-diffusing impurity than said semiconductor, connecting an electrode to each end of said wafer in non-rectifying contact with said surface zone, and attaching an electrical lead to each said electrode.

13. A method of fabricating a unipolar transistor comprising the steps of double-doping a monocrystalline semiconductor body with a fast-diffusing impurity of given conductivity type and a slow-diffusing impurity of opposite conductivity type, the concentration of said fast-diffusing impurity being greater than the concentration of said slow-diffusing impurity so that said body is of given conductivity type, alloying around said body an annular metal electrode, said metal inducing given conductivity type in said semiconductor and having a greater solubility for said fast-diffusing impurity than said semiconductor, thereby leaching a sufficient portion of said fast-diffusing impurity from the surface zone adjacent said annular electrode to leave an excess of said slow-diffusing impurity in said surface zone so that said surface zone is converted to opposite conductivity type, connecting an electrode to each end of said body in non-rectifying contact with said surface zone, and attaching an electrical lead to each said electrode.

14. The method as in claim 13 in which said semiconductor is germanium, said slow-diffusing impurity is antimony, said fast-diffusing impurity is nickel, and said annular electrode is indium.

15. The method as in claim 13 in which said semiconductor is germanium, said slow-diffusing impurity is arsenic, said fast-diffusing impurity is copper, and said annular electrode is indium.

16. The method as in claim 13 in which said semiconductor is germanium, said slow-diffusing impurity is indium, said fast-diffusing impurity is lithium, and said annular metal electrode is 99% lead–1% arsenic.

17. A method of fabricating a unipolar transistor comprising the steps of diffusing into a monocrystalline semiconductor wafer of given conductivity type an opposite conductivity type impurity so as to form a thin surface zone of said opposite conductivity type over said wafer, alloying around said wafer an annular electrode, said electrode containing given conductivity type impurity material so as to form a rectifying contact to said opposite conductivity type surface zone, connecting an electrode to each end of said wafer in non-rectifying contact with said surface zone, and attaching an electrical lead to each said electrode.

18. The method as in claim 17, in which said semiconductor wafer is P-type silicon, said given conductivity type impurity is phosphorus, and said annular electrode is indium.

References Cited in the file of this patent

UNITED STATES PATENTS

| | | |
|---|---|---|
| 2,829,422 | Fuller | Apr. 8, 1958 |
| 2,842,723 | Koch et al. | July 8, 1958 |
| 2,842,831 | Pfann | July 15, 1958 |
| 2,849,664 | Beale | Aug. 26, 1958 |